(12) United States Patent
Reimann et al.

(10) Patent No.: US 10,006,972 B2
(45) Date of Patent: Jun. 26, 2018

(54) MAGNETIC FIELD SENSOR HAVING PRIMARY AND SECONDARY MAGNETIC FIELD TRANSDUCERS WITH DIFFERENT MAGNETIC FIELD SATURATION CHARACTERISTICS

(71) Applicant: NXP B.V., Eindhoven (NL)

(72) Inventors: Klaus Reimann, Eindhoven (NL); Robert van Veldhoven, Eindhoven (NL); Jaap Ruigrok, Eindhoven (NL); Selcuk Ersoy, Eindhoven (NL); Ralf van Otten, Eindhoven (NL); Jörg Kock, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days. days.

(21) Appl. No.: 15/347,872

(22) Filed: Nov. 10, 2016

(65) Prior Publication Data
US 2017/0139016 A1    May 18, 2017

(30) Foreign Application Priority Data

Nov. 18, 2015 (EP) .................................... 15195215

(51) Int. Cl.
*G01R 33/09* (2006.01)
*G01R 33/00* (2006.01)

(52) U.S. Cl.
CPC ..... *G01R 33/0029* (2013.01); *G01R 33/0035* (2013.01); *G01R 33/096* (2013.01)

(58) Field of Classification Search
CPC ............ G01R 33/0029; G01R 33/0035; G01R 33/096

USPC ............................ 324/207.21, 252, 173–174
See application file for complete search history.

(56) References Cited

U.S. PATENT DOCUMENTS

| | | | |
|---|---|---|---|
| 5,574,364 A * | 11/1996 | Kajimoto | F02D 41/009 324/207.12 |
| 2001/0015878 A1 | 8/2001 | Varga et al. | |
| 2008/0186023 A1 | 8/2008 | Biziere et al. | |
| 2010/0315928 A1 | 12/2010 | Zhou et al. | |
| 2011/0037458 A1 | 2/2011 | Zhou et al. | |
| 2012/0092000 A1 * | 4/2012 | Lohberg | G01D 5/24438 324/173 |

OTHER PUBLICATIONS

Extended European Search Report for Patent Appln. No. 15195215.7 (dated Jun. 20, 2016).
Schmeißer, Fritz et al; "Application note AN98087—Rotational Speed Sensors KMI15/16"; Philips Semiconductors; 30 pages (Jan. 11, 1999).

\* cited by examiner

*Primary Examiner* — Jay Patidar
(74) *Attorney, Agent, or Firm* — Charlene R. Jacobsen

(57) ABSTRACT

A magnetic field sensor is disclosed for providing an output signal in response to an external magnetic field. The sensor comprises a primary magnetic field transducer for producing a primary signal in response to the external magnetic field and having a first magnetic field saturation characteristic; a secondary magnetic field transducer for producing a secondary signal in response to the external magnetic field and having a second magnetic field saturation characteristic. The first magnetic field saturation characteristic is different from the second magnetic field saturation characteristic. The sensor is configured to use the secondary signal to correct for errors in the output signal arising from saturation of the primary transducer.

15 Claims, 8 Drawing Sheets

MAGNETIC FIELD SENSOR HAVING PRIMARY AND SECONDARY MAGNETIC FIELD TRANSDUCERS WITH DIFFERENT MAGNETIC FIELD SATURATION CHARACTERISTICS

CROSS-REFERENCE TO RELATED APPLICATIONS

This application claims the priority under 35 U.S.C. § 119 of European patent application no. 15195215.7, filed Nov. 18, 2015 the contents of which are incorporated by reference herein.

FIELD

The field of the present disclosure is that of magnetic field sensors.

BACKGROUND

Magnetic sensors may be subject to saturation at high magnetic field strengths. Such saturation may cause non-linearity in the response of the sensor, and may even lead to a reversal of sensitivity, so that an increase in the field above saturation reduces the magnitude of the output of the sensor, rather than increasing it.

Magnetic sensors comprising anisotropic magnetoresistive (AMR) elements tend to become non-linear in response to a field that is above a saturation threshold. This non-linearity causes a distortion of the output signal. AMR based speed sensors are a specific type of magnetic sensor, which may be provided with a permanent magnet, producing a bias field. Such sensors tend to be required to respond to an external magnetic field in a specific direction, associated with an adjacent encoder wheel. The external magnetic field may be associated with teeth or permanent magnets of an encoder wheel. AMR speed sensors are typically required to be able to respond to a wide dynamic range of such an external magnetic field. At one end of the scale, high sensitivity is required to identify small external fields, and at the other end, saturation of the sensor can lead to problems due to distortion of the signal arising from non-linearity.

A solution that overcomes or ameliorates at least some of the above mentioned problems is desired.

SUMMARY

According a first aspect, there is provided a magnetic field sensor for providing an output signal in response to an external magnetic field, the sensor comprising:

a primary magnetic field transducer for producing a primary signal in response to the external magnetic field and having a first magnetic field saturation characteristic in response to the external magnetic field;

a secondary magnetic field transducer for producing a secondary signal in response to the external magnetic field and having a second magnetic field saturation characteristic in response to the external magnetic field;

wherein the first magnetic field saturation characteristic is different from the second magnetic field saturation characteristic, and the sensor is configured to use the secondary signal to correct for errors in the output signal arising from saturation of the primary transducer.

The external magnetic field may be a component of a magnetic field in a specific direction, relative to the sensor.

The first saturation characteristic may comprise a magnetic field component (having a defined orientation relative to the sensor) threshold at which the primary signal becomes saturated. The second saturation characteristic may comprise a magnetic field component (with the same defined orientation) threshold at which the secondary signal becomes saturated.

The primary magnetic field sensor may comprise an anisotropic magneto-resistive element.

The secondary magnetic field sensor may comprise an anisotropic magneto-resistive, AMR, element.

The primary magnetic field sensor may comprise a first and second AMR element arranged in a half-bridge configuration.

The secondary magnetic field sensor may comprise a third and fourth AMR element arranged in a half-bridge configuration.

The third and fourth AMR elements may each have at least twice the resistance of the first and second AMR elements.

The AMR elements may each comprise a plurality of adjacent conducting tracks with a track orientation. The track orientation of the first AMR element may be at substantially 90 degrees to the track orientation of the second AMR element. The track orientation of the third AMR element may be at substantially 90 degrees to the fourth AMR element. The track orientation of the third AMR element may be at an offset angle of between 15 and 75 degrees to the track orientation of the first AMR element, modulo 90 degrees (i.e. with any multiple of 90 degrees added or subtracted from the offset angle).

The offset angle may be: between: 25 and 65 degrees; 30 and 60 degrees, 35 and 55 degrees; or substantially 45 degrees (all modulo 90 degrees).

The primary transducer may comprise a plurality of AMR bridges, the primary transducer optionally being configured to provide a primary signal that is responsive to a magnetic field gradient.

The magnetic field sensor may further comprise a permanent magnet arranged to produce a bias field. The bias field may be oriented at 90 degrees to the external field to which the transducers are responsive.

The bias field is at substantially 45 degrees to the track orientation of the first AMR element.

The sensor may be a speed sensor configured to provide an output signal that is responsive to a rate of threshold crossings of the output of the primary transducer.

The sensor may be configured to veto threshold crossings of the primary signal from affecting the output signal, the veto derived from the secondary signal.

The veto may comprise an enable window derived from threshold crossings of the secondary signal.

The sensor may be configured to operate in low field mode when the external magnetic field remains substantially below the first magnetic field saturation threshold and to operate in a high field mode in response to an external magnetic field above the first magnetic field saturation threshold.

In the first mode, the output signal may be derived without using the secondary signal, and in the second mode, the output signal may be derived at least in part with reference to the secondary signal.

A signal processing device may be provided for correcting the output signal based on the secondary signal. The signal processing device may comprise an ASIC (application specific integrated circuit) and/or an FPGA (field programmable gate array). The signal processing device (e.g. ASIC) may comprise analogue, digital and/or mixed signal circuit elements. The signal processing device may comprise a microprocessor or a microcontroller.

There may be provided a computer program, which when run on a computer, causes the computer to configure any apparatus, including a circuit, controller, sensor, filter, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software implementation may be an assembly program.

The computer program may be provided on a computer readable medium, which may be a physical computer readable medium, such as a disc or a memory device, or may be embodied as a transient signal. Such a transient signal may be a network download, including an internet download.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
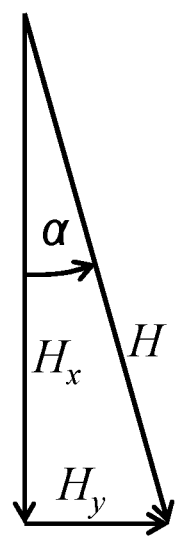
FIG. 1 is a simplified diagram of magnetic fields at a magnetic sensor.

It should be noted that the figures are diagrammatic and not drawn to scale. Relative dimensions and proportions of parts of these figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

Referring to FIG. 1, a representation of magnetic fields at a magnetic field sensor is shown. The field H is made up of a bias field component $H_x$, arising from a permanent magnet or any other means, typically in close proximity to the sensor, and an external field component $H_y$ which may be generated by an adjacent encoder wheel. As depicted, the bias field $H_x$ is typically arranged at an angle to the field generated by an encoder wheel, for example at approximately 90 degrees. An angle $\alpha$ can be identified, associated with the angle of the field H relative to the direction of the bias field $H_x$.

Anisotropic magnetoresistive materials have an electrical resistance that depends on the angle between current flow through the material and the local magnetization vector M. The local magnetization vector M points approximately in the direction of the magnetic field vector H. The response of an AMR material to an external magnetic field that is perpendicular to current flow is unipolar, with resistance decreasing in response to the perpendicular field. More generally, AMR material is responsive to the magnetization orientation, relative to the current flow through the material. The resistance variation can be approximated by a scaled cosine function of twice the angle.

In order to shift the symmetric response of an AMR element and provide an anti-symmetric response, it is conventional to use a "barber pole" arrangement, in which a plurality of adjacent conducting tracks are provided at 45 degrees to the overall current flow through the element.

Figure 2A:
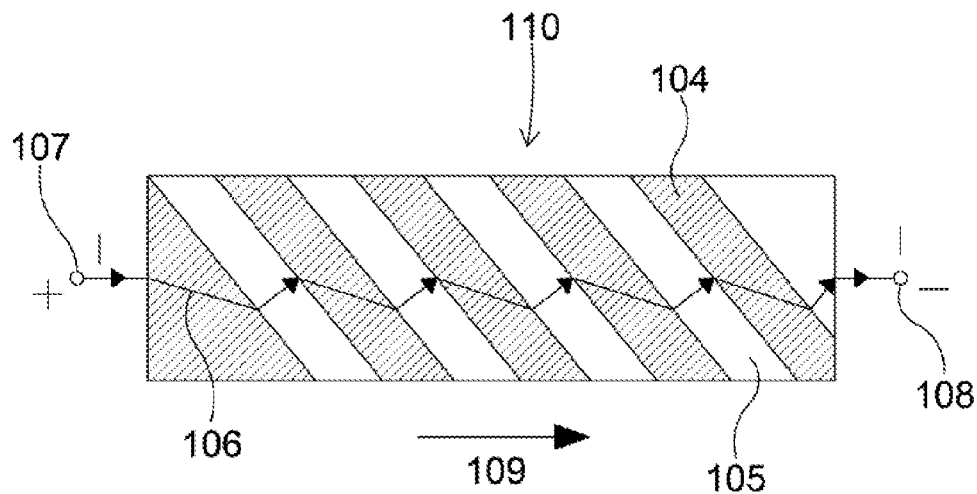
FIG. 2a is a schematic of an AMR element illustrating "barber pole" conducting stripes at 45 degrees to the overall current path, and the path of current through such a device.

FIG. 2a shows an example of a "barber pole" AMR element 110, comprising a rectangle of AMR material 105 (e.g. permalloy), on which is disposed a plurality of adjacent stripes or tracks 104 of conducting material (e.g. aluminium). Each stripe 104 is oriented at 45 degrees to the overall current flow, indicated by arrow 109. The current path 106 (between current source 107 and current sink 108) indicates how the current in the AMR material 105 flows at an angle of 45 degrees to arrow 109 (which may be the direction of an applied bias field $H_x$).

Figure 2B:
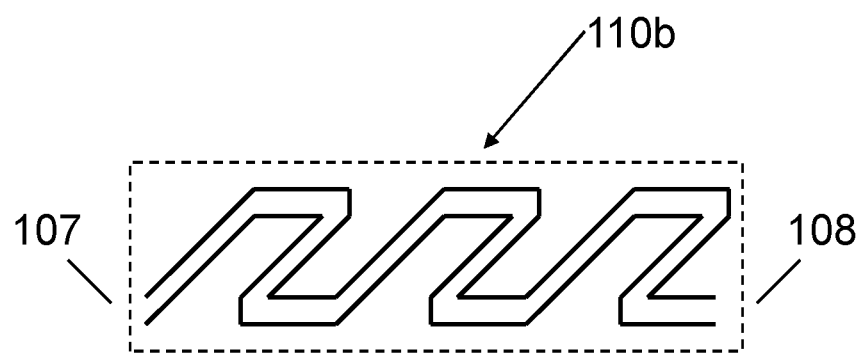
FIG. 2b is an alternative configuration of an AMR element without "barber pole" conducting stripes, in which the AMR material is patterned into a series of adjacent stripes.

Instead of Barber poles, the AMR material can be patterned into tracks that are oriented to force the current flow into a desired orientation. Referring to FIG. 2b, a sensor element 110b is shown, comprising narrow AMR tracks at a 45 degree angle to the overall current path from 107 to 108. In some embodiments, the horizontal connecting segments may be shorter, and/or their resistance may be reduced using a patterned conducting layer (e.g. aluminium).

AMR sensor elements may be arranged in a half-bridge or full-bridge configuration. In a half-bridge configuration, first and second AMR elements are connected in series. The second element is nominally the same as the first element, with the exception that the second element is arranged with an opposite polarity of sensitivity to the external field $H_y$ compared with the first element (for example, the "barber pole" tracks of the first element may be at 90 degrees to those of the second element). The voltage at the central node between the first and second resistive element changes in response to the external field $H_y$. An advantage of this bridge configuration is that common mode changes in resistance (i.e. common to first and second resistive element) do not affect the voltage at the central node. Although beneficial, this invention does not rely on bridges. A single sensitive element is sufficient as field sensor.

Figure 3:
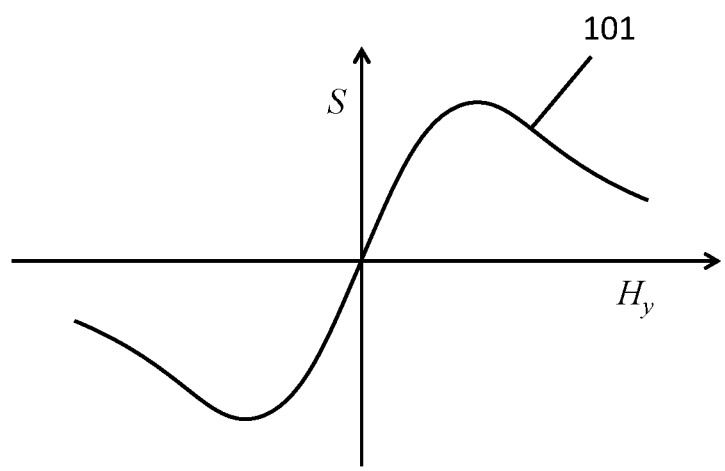
FIG. 3 is a graph showing the output signal from an AMR half-bridge sensor, as a function of the external field $H_y$.

FIG. 3 shows the output signal 101 from an AMR half-bridge as a function of the external field $H_y$, which may be generated by an encoder wheel (e.g. a ferromagnetic toothed wheel). In this example, the half-bridge comprises a pair of AMR resistive elements, with stripes at 45 degrees to a bias field $H_x$. The tracks of the first element are at 90 degrees to those of the second element. In embodiments of the invention, the stripes or tracks may comprise either conducting "barber pole" tracks on an AMR element, or tracks defined in AMR material. In either case, the tracks/stripes define a direction of current flow through the AMR element.

For low $H_y$, the response is substantially linear, but as the field approaches saturation, the response rolls off, and eventually starts to decrease. The maximum values of the signal S correspond with the overall field vector H being at an angle α of approximately 45 degrees to $H_x$ (i.e. with the magnitude of the external field $H_y$ being equal to the magnitude of the bias field $H_x$).

Figure 4:
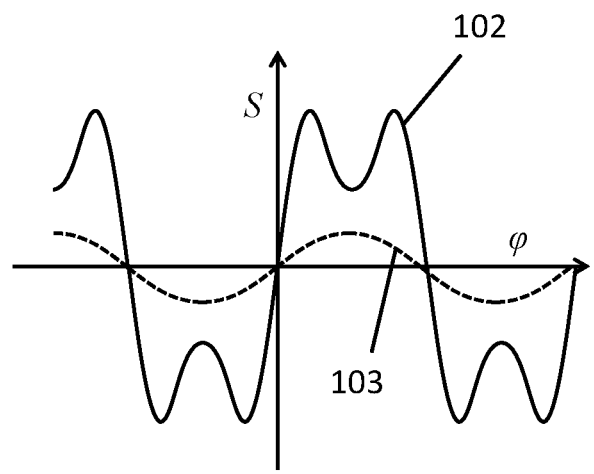
FIG. 4 is a graph showing the output signal from an AMR half-bridge as a function of encoder wheel angle for a highly saturated signal, and a weak (unsaturated) signal.

FIG. 4 shows example output signals as a function of encoder wheel angle φ (for the type of AMR half-bridge discussed above) for a highly saturated signal 102 and for a weak signal 103. In the case of the highly saturated signal 102, the change in field $H_y$ associated with each tooth of the encoder wheel is greater than the bias field $H_x$, resulting in distortion of the output signal, and dips in the signal. These dips can cause problems. In many applications, threshold crossings (e.g. zero crossings) are used to infer the rate at which encoder teeth are passing a sensor. Dips in the sensor output may be detected as a threshold crossing, and can therefore be interpreted as extra encoder movements, or lead to a false detection of the direction of rotation.

If the bias field strength $H_x$ is stronger than the maximum expected external field $H_y$, such dips will not occur. However, strong bias magnets are expensive and/or bulky. Furthermore, a strong bias field $H_x$ reduces the sensitivity of the sensor, because the angle α for a given external field $H_y$ is reduced. A reduced sensitivity decreases signal to noise ratio, increasing jitter. Magnetic sensors that detect a field gradient (such as certain types of speed sensor) may be particularly prone to errors in detection resulting from saturation, because a difference signal between two half-bridges (corresponding with a gradient) may be used to detect encoder position.

Figure 5:
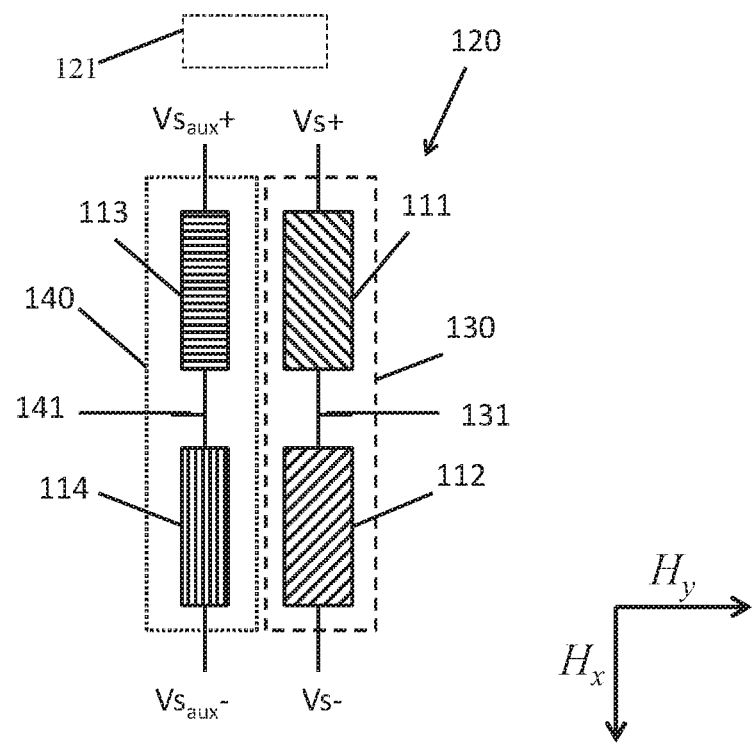
FIG. 5 is a schematic of a sensor according to an embodiment, comprising a primary transducer half-bridge and a secondary transducer half-bridge.

FIG. 5 shows a sensor 120 according to an embodiment. The sensor 120 comprises a primary transducer 130 and a secondary transducer 140. The sensor 120 may further comprise a bias magnet 121 for applying a bias field Hx. Also other means of biasing can be devised by the person skilled in the art, e.g., exchange bias coupling. The hatching in FIG. 5 represents the direction of the conducting tracks of the AMR element (e.g. barber pole or patterned AMR tracks).

The primary transducer 130 is a half-bridge comprising a first AMR element 111 and a second AMR element 112. The primary sensor half-bridge is arranged with an axis at 90 degrees to the bias field $H_x$. In use, a positive bias voltage Vs+ may be applied at one end of the primary transducer 130 and a negative bias voltage Vs− may be applied at the other end. The sensor 120 may comprise a circuit (or circuit elements) for providing these bias voltages. The primary signal 131 (output from the primary transducer 130) is the voltage at the central node between the first and second AMR elements 111, 112.

The AMR elements 111, 112 of the primary transducer 130 each comprise a plurality of adjacent conducting tracks (e.g. barber pole stripes or patterned AMR material). The tracks of the first element 111 are at +45 degrees to the axis of the half-bridge of the primary transducer 130, and the tracks of the second element 112 are at −45 degrees to the axis of the half-bridge of the primary transducer (i.e. the tracks of the first element 111 are at 90 degrees to the tracks of the second element 112). The primary transducer 130 is therefore a conventional half-bridge arrangement.

The secondary transducer 140 in this example embodiment comprises a further AMR half-bridge, comprising a third AMR element 113 and fourth AMR element 114. In use, a positive bias voltage Vs+ may be applied at one end of the primary transducer and a negative bias voltage Vs− may be applied at the other end. The bias voltages applied to the secondary transducer may be lower (e.g. by a factor of at least 1.5, 2, or 3) than those applied to the primary sensor, which may save power. The sensor 120 may comprise a circuit (or circuit elements) for providing these bias voltages. The secondary signal 141 (output from the secondary transducer 140) is the voltage at the central node between the third and fourth AMR elements 113, 114.

The AMR elements 113, 114 of the secondary transducer 140 each comprise a plurality of adjacent conducting tracks. The tracks of the third element 113 are at 90 degrees to the axis of the primary half-bridge, and the tracks of the fourth element 114 are parallel with the axis of the primary half-bridge (i.e. the tracks of the third element 113 are at 90 degrees to the tracks of the fourth element 114). The secondary transducer therefore has a symmetric response to the external field $H_y$, with the secondary signal being at a maximum when there is no external field $H_y$, the resistance of the third element 113 thereby being minimised by the bias field $H_x$. A positive or negative external field $H_y$ will therefore result in a decrease in the secondary signal.

Other element combinations are also possible, e.g., the elements 113 and 114 may be swapped, leading to a signal inversion. Or the resistance of an element could be measured directly without the need of a (half-)bridge.

FIG. 5 illustrates a primary output signal 132 and a secondary output signal 142, both as a function of external field $H_y$. When the field angle α=45° (i.e. with $H_y=H_x$), the secondary output 142 is approximately zero, and the primary output 132 is at maximum. The secondary output 142 is monotonic in the high field region (e.g. with α>30°), which means that secondary output 142 can be used to correct errors in the primary output 132 arising from non-linearity.

Although it is convenient to use a secondary transducer implemented in the same technology as the primary transducer, this is not essential, and any sensor type can be used (for example, a Hall sensor or a lateral magneto-transistor). The secondary transducer 140 may be, in general, any transducer that provides an output signal that is responsive to the external field $H_y$ and that has a higher saturation threshold in response to the external field $H_y$ than the primary transducer 130. The output from the secondary transducer 140 is then used by the sensor 120 to correct for errors in the output signal from the sensor as a whole that would otherwise arise from saturation of the primary transducer 130.

Figure 6:
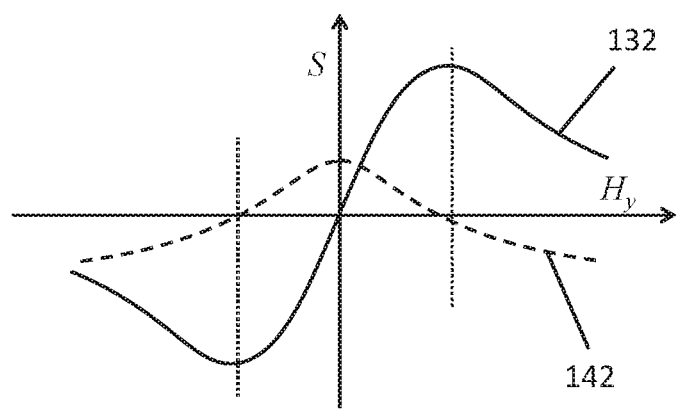
FIG. 6 is graph showing the output signal from the primary and secondary transducer half-bridges of FIG. 5 as a function of external magnetic field $H_y$.

One way of doing this is to determine the angle α from the primary signal and secondary signal. It is clear from the graph of FIG. 6 that the angle α can be determined from the combination of the primary and secondary output signals 132, 142 (e.g. by table look-up or analytical calculations). Once the angle α is obtained, the external field $H_y$ is straightforward to determine if the applied bias field $H_x$ is known. Simpler schemes are also possible.

In some embodiments, the sensor 120 may be configured with two modes. In a first, low field mode, the sensor 120 may rely on the output of the primary transducer 130 for the output signal from the sensor as a whole. In a second, high field mode, the sensor 120 may use the output from the secondary transducer 140, or a combination of outputs from the first transducer 130 and second transducer 140 to determine the output signal from the sensor 120.

In the case where the sensor 120 is configured to provide a clock signal that is timed by threshold/zero crossings of the magnetic field (e.g. associated with passing encoder teeth), the output from the primary transducer 130 can be used to determine threshold crossings up to a threshold peak output from the primary transducer 130 (for example corresponding with α=30°. Once this threshold is exceeded, threshold/zero crossings of the output from the secondary transducer 140 may be used to time the output of the sensor.

The secondary transducer 140 can also be configured to disable the clock pulse generation of the primary transducer 130. For example, in FIG. 6, when the signal 142 falls below a threshold, e.g., S=0, all pulse generation from the primary signal 132 could be disabled.

The secondary transducer AMR elements may be smaller than those of the primary transducer, since they do not need to be as sensitive. Furthermore, the bias voltage applied to the AMR elements of the secondary transducer may be lower than the bias voltage applied to AMR elements of the primary transducer or it might even be switched off when not needed. Plural secondary AMR elements may each be connected in series to provide a higher resistance, and therefore reduced power. In some embodiments the primary or secondary transducers may comprise a folded bridge arrangement (like that of FIG. 8).

Figure 7:
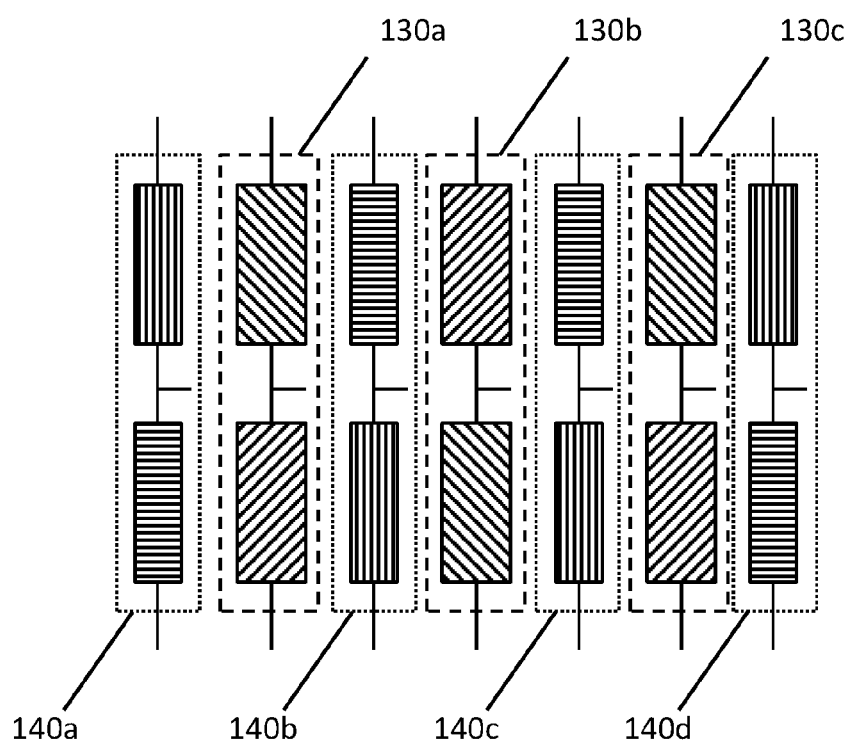
FIG. 7 is a schematic of a sensor according to an alternative embodiment, comprising a primary transducer with a first, second and third half-bridge, and a secondary transducer with four half-bridges, interleaved with the primary transducer.

FIG. 7 shows an alternative embodiment of a sensor 120, in which the primary transducer comprises a first, second and third half-bridge: 130*a-c*. The three half bridges allow for direction recognition. Each of the primary half-bridges 130*a-c* have parallel axes, defining a primary axis (this is the sense direction $H_y$, which is usually perpendicular to the bias field $H_x$). The first half-bridge 130*a* and third half-bridge 130*c* have similar arrangements of resistor elements, and each therefore provides an output signal (from the half-bridge centre node) with the same polarity relative to the external field $H_y$. The second (centre) half-bridge 130*b* is inverted relative to the first and third half-bridges, so provides an output signal with the opposite polarity to that of the first and third half-bridges 130*a*, 130*c*.

The secondary transducer comprises four half-bridges 140*a-d*, interleaved with the half-bridges 130*a-c* of the primary transducer. Either side of the first primary half-bridge 130*a* are the first and second secondary half-bridges 140*a* and 140*b*. Either side of the second primary half-bridge 130*b* are the second and third secondary half-bridges 140*b*, 140*c*. Either side of the third primary half-bridge 130*c* are the third and fourth secondary half-bridges 140*c*, 140*d*. The first and fourth secondary half-bridge 140*a*, 140*d* each comprise an upper AMR element with conducting stripes that are parallel with the primary axis, and a lower AMR element with conducting stripes that are perpendicular with the primary axis. The second and third secondary half-bridge 140*b*, 140*c* comprise an upper AMR element with conducting stripes that are perpendicular with the primary axis, and a lower AMR element with conducting stripes that are parallel with the primary axis. The polarity of response of the first and fourth secondary half-bridges 140*a*, 140*d* is therefore opposite to that of the second and third secondary half-bridges 140*b*, 140*c*.

In an alternative embodiment, the second/central primary half-bridge 130*b* may be inverted, so as to provide the same polarity of response as the first and third primary half-bridges 130*a*, 130*c*. This may be appropriate for a gradient sensor, in which the central half-bridge provides information as to the direction of rotation of an encoder wheel, and the difference between the outputs from the first and second half-bridge provides the gradient of the magnetic field. In other embodiments, the central primary half-bridge may be omitted.

Figure 8:
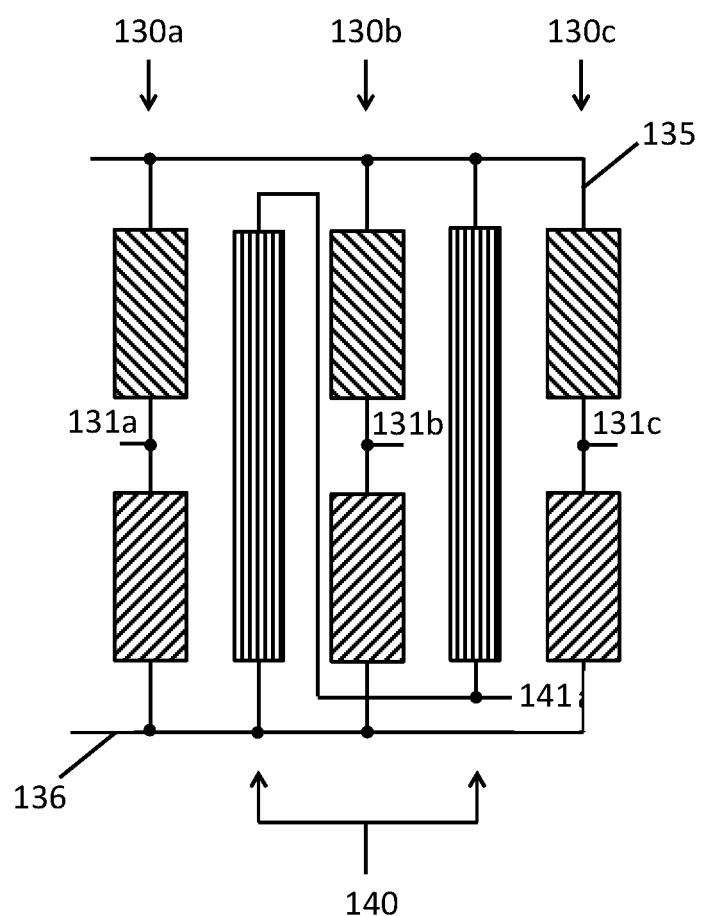
FIG. 8 is a schematic of a sensor according an a further embodiment, comprising a primary transducer with a first, second and third half-bridge, and a secondary transducer comprising a single folded bridge.

FIG. 8 shows a further sensor according to an embodiment, comprising a primary transducer having first, second and third half-bridges 130*a-c*, and a secondary transducer 140 comprising a folded half-bridge, with first and second secondary AMR elements. The first and second secondary AMR elements of the folded half-bridge are on either side of the second/central primary transducer half-bridge 130*b*. A positive voltage supply may be provided to rail 135 and negative voltage supply provided to rail 136.

The AMR elements of each primary transducer half-bridge 130*a-c* each comprise a plurality of adjacent conducting tracks. The tracks of the upper AMR element of each half-bridge are at +45 degrees to the axis of the primary transducer, and the tracks of the lower element of each AMR of each half-bridge of the primary transducer is at −45 degrees to the axis of the primary transducer (i.e. the tracks of the upper AMR element are at 90 degrees to the tracks of the lower AMR element in each bridge). A bias field $H_x$ may be applied along the axis of the primary transducer. The respective output signals from the first, second and third primary half-bridges are indicated by 131*a-c*.

The secondary transducer AMR elements both comprise adjacent conducting tracks that are oriented parallel with the primary transducer axis, so that current through the AMR material of the secondary transducer flows in a direction substantially perpendicular to the external field to be detected $H_y$. The secondary transducer 140 is thereby configured to act as a gradient sensor, so that differences in the external field $H_y$ at the first and second AMR sensor of the secondary sensor result in a secondary output signal.

Regardless of the specific implementation of the primary and secondary transducer, the sensor 120 may comprise a signal processing portion, that receives the primary output 131 and secondary output 141, and which processes the signals to produce an output signal from the sensor. The signal processing portion may comprise analog and/or digital signal processing elements, and/or firmware for defining how the output signal from the sensor is determined with reference to primary and secondary output signals.

Figure 9:
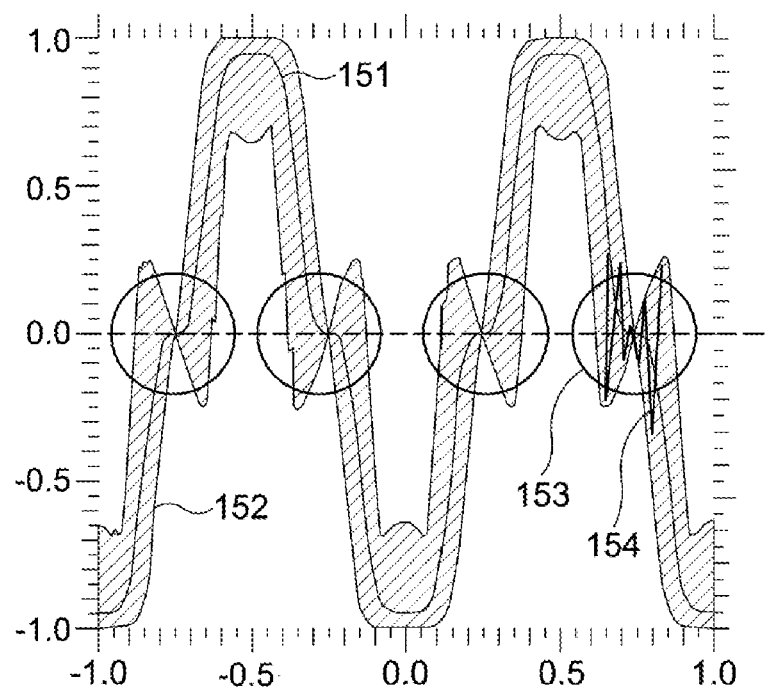
FIG. 9 is a graph showing a simulated output from a primary transducer of the sensor of FIG. 8 at the onset of saturation.

FIG. 9 is a graph of a simulated normalised primary output signal 151 from the embodiment according to FIG. 8, corresponding with the difference between primary output signals 131*c* and 131*a* (i.e. 131*c*-131*a*) with an encoder field strength at the onset of saturation. The hatched area 152 around the simulated output signal 151 indicate the influence of external uniform noise fields on the simulated output signal 151. The zero crossing regions are indicated by circles 153. The external field $H_y$ was assumed to vary sinusiodally.

The curve 154 is one example of a realistic primary transducer output in the zero crossing region. Multiple zero crossings are visible, which would disturb any speed indication derived from the output of the primary sensor based on zero crossings.

Figure 10:
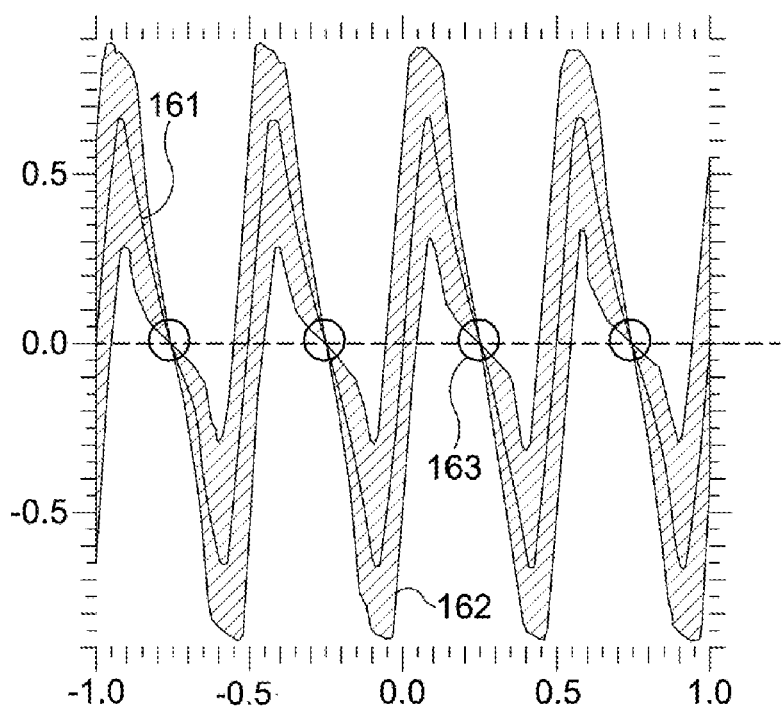
FIG. 10 is a graph showing a simulated output from the secondary transducer of FIG. 8 at the onset of saturation of the primary transducer.

FIG. 10 is a graph of a simulated normalised secondary output 161 from the embodiment according to FIG. 8, corresponding with the signal at 141 in FIG. 8. As is clear from the graph, threshold/zero crossings of this signal can be detected with low noise, particularly the falling zero crossings (indicated by circles 163), where the noise envelope 162 is pinched off to a minimum. These falling zero crossings also have timing that coincides with the timing of zero crossings of the primary signal 151. The frequency of the signal 161 from the secondary transducer is double that of the signal 151 from the primary transducer, so detecting falling zero crossings would provide a signal with the same frequency and timing as an accurate signal from the primary transducer at high external fields $H_y$.

One potential problem with the use of a secondary transducer is that, due to spatial separation between the primary and secondary transducers, the external field at the secondary transducer may be different from that at the primary transducer. Simulations have shown that embodiments still function well, even when there is a considerable gradient in the external field $H_y$.

Figure 11:
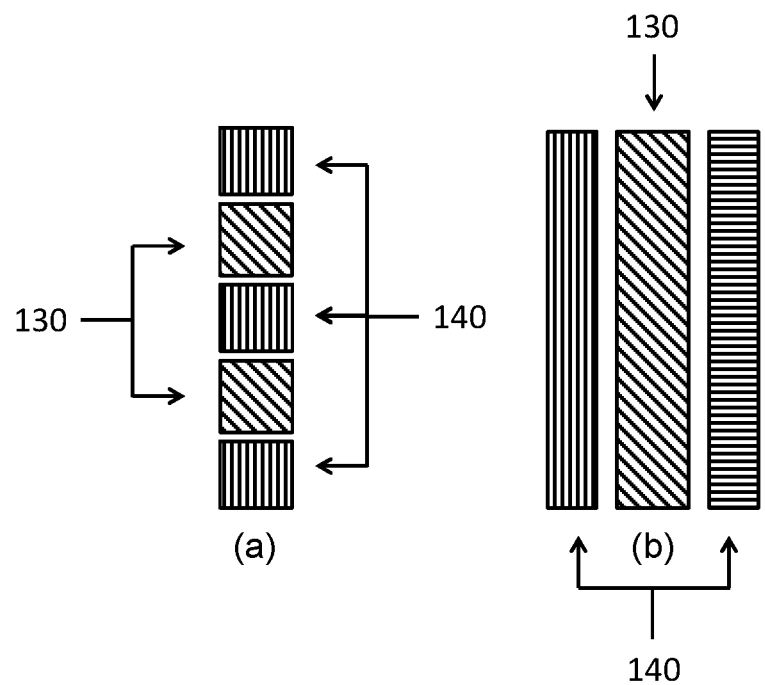
FIG. 11 schematically illustrates different arrangements of adjacent primary and secondary AMR transducer elements.

FIG. 11 illustrates some ways in which primary and secondary transducer elements can be laid out to minimise difficulties arising from external field gradients (or gradients of the external field gradient). In FIG. 11a, primary and secondary sensor elements are interleaved along the primary transducer axis. The relative sizes of the primary and secondary elements are not shown to scale, and the secondary elements could be smaller than the primary elements (for example the secondary elements could occupy 50%. 20%, 10% or less of the area of the primary elements). In FIG. 11b, the secondary sensor elements are positioned on either side of the primary sensor element, with the axis of each sensor element (or both primary and secondary elements) are in parallel. More options can be envisioned. For example, the primary and secondary transducers could be stacked in the third dimension. Also the tracks of 140 might have the same orientation in FIG. 11b.

Figure 12:
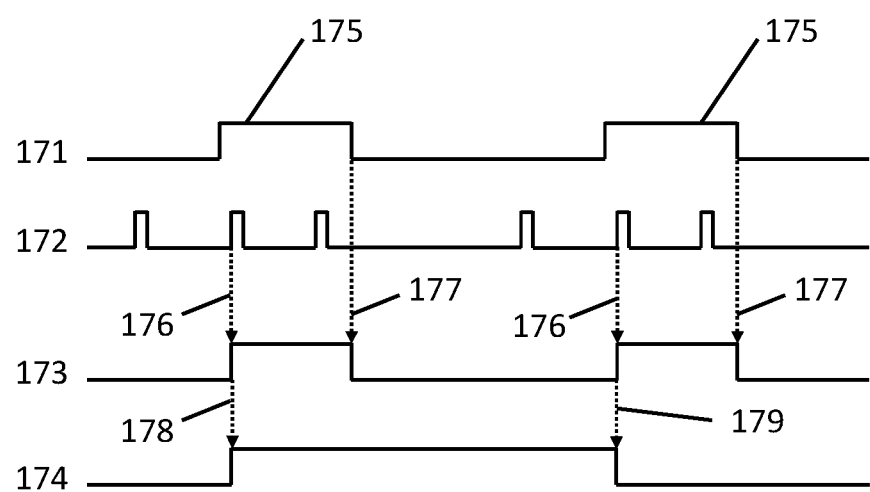
FIG. 12 is a timing graph showing an example of how primary and secondary transducer outputs may be combined to provide a sensor output that is corrected for non-linearity arising from saturation.

FIG. 12 shows an example timing diagram to illustrate one way of combining the signals from the primary and secondary transducers. From top to bottom, the traces show: a primary threshold crossing signal 171, a secondary threshold crossing signal 172, a combined signal 173 and a sensor output signal 174.

The primary threshold crossing signal 171 is toggled between high and low in response to threshold crossings of the primary transducer output. The secondary threshold crossing signal 172 is toggled between high and low in response to threshold crossings of the secondary transducer output. The threshold for the primary transducer is set widely, resulting in a wide enabling window. The narrower secondary threshold window is then used for accurate timing.

The combined signal 173 is toggled high (indicated by arrow 176) by the first leading edge of the secondary threshold crossing signal 172 that occurs while the primary threshold crossing signal 171 is high, and is toggled low (indicated by arrow 176) by the falling edge of the primary threshold crossing signal 171.

The output signal 174 is toggled between high and low by the leading edge of the combined signal 173.

This method of combining the primary and secondary signals may be particularly applicable for correcting strong distortions arising from very strong fields. The secondary threshold crossing signal 172 in the example includes spurious pulses that are the result of distortion. In this embodiment, the role of the primary and secondary transducers has changed, and the primary transducer output is used to veto pulses (or threshold crossings) of the secondary output. In other embodiments, for example, with lower fields, a vetoing scheme in which the secondary signal is used to veto a signal from the primary transducer may be used.

Figure 13:
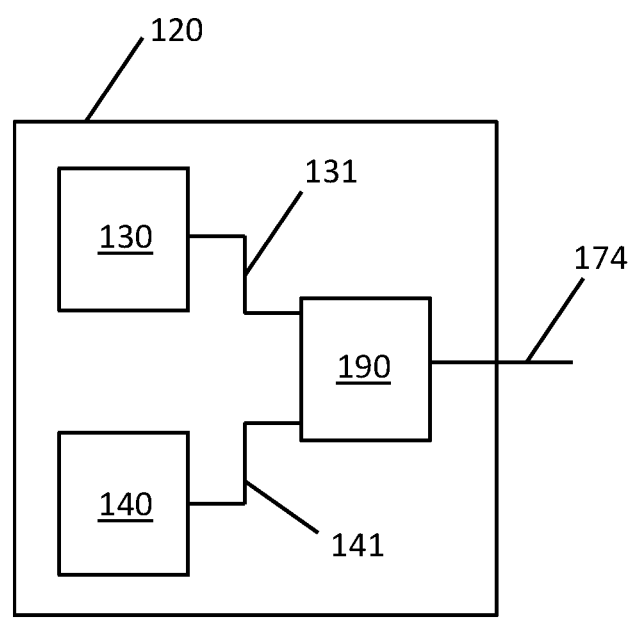
FIG. 13 is a schematic diagram of an example embodiment of a sensor.

FIG. 13 shows an example embodiment of a sensor 120 comprising a primary transducer 130, secondary transducer 140 and signal processing element 190, which receives the primary output signal 131 and secondary output signal 141 and produces a sensor output signal 174 (e.g. indicating the rate at which encoder teeth are passing the sensor 120). In some embodiments the signal processing element 190 may comprise ADCs for the primary and secondary signals 131, 141, and digital signal processing (e.g. a processor) for determining the output signal 174. In other embodiments the signal processing element 190 may comprise analogue signal processing components or a mix of analogue and digital signal processing components.

From reading the present disclosure, other variations and modifications will be apparent to the skilled person. Such variations and modifications may involve equivalent and other features which are already known in the art of magnetic sensors, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality. Any reference signs in the claims shall not be construed as limiting the scope of the claims.

The invention claimed is:

1. A magnetic field sensor for providing an output signal in response to an external magnetic field, the sensor comprising:
   a primary magnetic field transducer for producing a primary signal in response to the external magnetic field and having a first magnetic field saturation characteristic;
   a secondary magnetic field transducer for producing a secondary signal in response to the external magnetic field and having a second magnetic field saturation characteristic;

wherein the first magnetic field saturation characteristic is different from the second magnetic field saturation characteristic, and the sensor is configured to use the secondary signal to correct for errors in the output signal arising from saturation of the primary transducer.

2. The magnetic field sensor of claim 1, wherein the sensor is configured to operate in low field mode when the external magnetic field remains substantially below a first magnetic field saturation threshold and to operate in a high field mode in response to an external magnetic field above the first magnetic field saturation threshold, wherein, in the first mode, the output signal is derived without using the secondary signal, and in the second mode, the output signal is derived at least in part with reference to the secondary signal.

3. The magnetic field sensor of claim 1, wherein the primary magnetic field sensor comprises an anisotropic magneto-resistive element.

4. The magnetic field sensor of claim 1, wherein the secondary magnetic field sensor comprises an anisotropic magneto-resistive (AMR) element.

5. The magnetic field sensor of claim 1, wherein the primary magnetic field sensor comprises first and second AMR elements arranged in a half-bridge configuration.

6. The magnetic field sensor of claim 5, wherein the secondary magnetic field sensor comprises third and fourth AMR elements arranged in a half-bridge configuration.

7. The magnetic field sensor of claim 6, wherein:
the AMR elements each comprise a plurality of adjacent conducting tracks with a track orientation;
the track orientation of the first AMR element is at substantially 90 degrees to the track orientation of the second AMR element;
the track orientation of the third AMR element is at substantially 90 degrees to the fourth AMR element; and
the track orientation of the third AMR element is at an offset angle of between 15 and 75 degrees to the track orientation of the first AMR element.

8. The magnetic field sensor of claim 7, wherein the offset angle is between 30 and 60 degrees, or substantially 45 degrees.

9. The magnetic field sensor of claim 5, wherein the primary transducer comprises a plurality of AMR bridges, the primary transducer being configured to provide a primary signal that is responsive to a magnetic field gradient.

10. The magnetic field sensor of claim 1, further comprising a bias magnet arranged to produce a bias field.

11. The magnetic field sensor of claim 10, wherein:
the primary magnetic field sensor comprises first and second AMR elements arranged in a half-bridge configuration;
the secondary magnetic field sensor comprises third and fourth AMR elements arranged in a half-bridge configuration;
the AMR elements each comprise a plurality of adjacent conducting tracks with a track orientation;
the track orientation of the first AMR element is at substantially 90 degrees to the track orientation of the second AMR element;
the track orientation of the third AMR element is at substantially 90 degrees to the fourth AMR element;
the track orientation of the third AMR element is at an offset angle of between 15 and 75 degrees to the track orientation of the first AMR element; and
the bias field is at substantially 45 degrees to the track orientation of the first AMR element.

12. The magnetic field sensor of claim 1, wherein the secondary transducer has at most half the power consumption of the primary transducer.

13. The magnetic field sensor of claim 1, wherein the sensor is a speed sensor, the sensor being configured to provide an output signal that is responsive to a rate of threshold crossings of the primary signal.

14. The magnetic field sensor of claim 13, wherein the sensor is configured to:
veto threshold crossings of the primary signal from affecting the output signal, the veto derived from the secondary signal; or
veto threshold crossings of the secondary signal from affecting the output signal, the veto derived from the primary signal.

15. The magnetic field sensor of claim 14, wherein the veto comprises an enable window derived from threshold crossings of the primary or secondary signals.

* * * * *